United States Patent
Shi et al.

(10) Patent No.: US 12,371,159 B2
(45) Date of Patent: Jul. 29, 2025

(54) HELICOPTER ACTIVE NOISE SUPPRESSION DEVICE INTEGRATING SOUND ARRAY AND ON-PROPELLER CONTROL

(71) Applicant: NANJING UNIVERSITY OF AERONAUTICS AND ASTRONAUTICS, Jiangsu (CN)

(72) Inventors: Yongjie Shi, Jiangsu (CN); Taihang Ma, Jiangsu (CN); Zhiyuan Hu, Jiangsu (CN); Guohua Xu, Jiangsu (CN); Yang Liu, Jiangsu (CN)

(73) Assignee: NANJING UNIVERSITY OF AERONAUTICS AND ASTRONAUTICS, Jiangsu (CN)

( * ) Notice: Subject to any disclaimer, the term of this patent is extended or adjusted under 35 U.S.C. 154(b) by 0 days.

(21) Appl. No.: 18/257,610

(22) PCT Filed: Jan. 25, 2022

(86) PCT No.: PCT/CN2022/073718
§ 371 (c)(1),
(2) Date: Jun. 15, 2023

(87) PCT Pub. No.: WO2023/103168
PCT Pub. Date: Jun. 15, 2023

(65) Prior Publication Data
US 2024/0034463 A1    Feb. 1, 2024

(30) Foreign Application Priority Data
Dec. 6, 2021    (CN) .......................... 202111476971.X

(51) Int. Cl.
*B64C 27/00*    (2006.01)
*G06F 30/15*    (2020.01)
(Continued)

(52) U.S. Cl.
CPC ...... *B64C 27/001* (2013.01); *G10K 11/17875* (2018.01); *G10K 11/17883* (2018.01);
(Continued)

(58) Field of Classification Search
None
See application file for complete search history.

(56) References Cited

U.S. PATENT DOCUMENTS 4,562,589 A * 12/1985 Warnaka .......... G10K 11/17854
  381/86
4,689,821 A *  8/1987 Salikuddin ....... G10K 11/17883
  381/71.14

(Continued)

FOREIGN PATENT DOCUMENTS

CA    2235309 A1 * 10/1999  ............ F16F 15/005
CN    105092204 A  * 11/2015  ................ B64F 5/60
(Continued)

OTHER PUBLICATIONS

Guicking, D., "Patents on Active Control of Sound and Vibration, an Overview, Second revised and enlarged edition", May 2009. (Year: 2009).*

(Continued)

*Primary Examiner* — Mohammad Ali
*Assistant Examiner* — Kelvin Booker
(74) *Attorney, Agent, or Firm* — Mark T. Vogelbacker; Eckert Seamans Cherin & Mellott, LLC

(57) ABSTRACT

A helicopter active noise suppression device integrating a sound array and on-propeller control, which relates to the technical field of helicopter noise reduction, includes an annular loudspeaker array, a plurality of force exciters, an error microphone, an Active Noise Cancellation (ANC) controller, a cockpit sensor, and an airborne computer. The annular loudspeaker array is arranged at a rotor hub and (Continued)

unsteady force exciters are arranged at each blade trailing edge to construct a sound field in an reversed phase to the sound wave of an original sound field with an ANC principle, thereby counteracting the noise and realizing the noise reduction of all-domain and all-type helicopter noise.

8 Claims, 4 Drawing Sheets

(51) Int. Cl.
*G06F 30/28* (2020.01)
*G10K 11/178* (2006.01)

(52) U.S. Cl.
CPC .... *B64C 2027/004* (2013.01); *B64C 2220/00* (2013.01); *G06F 30/15* (2020.01); *G06F 30/28* (2020.01)

(56) References Cited

U.S. PATENT DOCUMENTS

| | | | | |
|---|---|---|---|---|
| 4,715,559 A * | 12/1987 | Fuller | | G10K 11/17883 381/71.4 |
| 4,819,182 A * | 4/1989 | King | | B64C 27/001 244/17.11 |
| 5,310,137 A * | 5/1994 | Yoerkie, Jr. | | B64C 27/001 244/17.11 |
| 10,796,585 B2 * | 10/2020 | Greenwood | | G05D 1/042 |
| 2010/0002892 A1 * | 1/2010 | Togawa | | G10K 11/17854 381/71.12 |
| 2013/0308785 A1 * | 11/2013 | Christoph | | G10K 11/17853 381/71.1 |
| 2015/0172813 A1 * | 6/2015 | Goto | | G10K 11/17854 381/71.1 |
| 2018/0366007 A1 * | 12/2018 | Greenwood | | G08G 5/34 |
| 2019/0008824 A1 | 3/2019 | Goto et al. | | |
| 2019/0088244 A1 * | 3/2019 | Goto | | B64C 27/463 |
| 2019/0297412 A1 * | 9/2019 | Hentunen | | G10K 11/175 |

FOREIGN PATENT DOCUMENTS

| | | | | |
|---|---|---|---|---|
| CN | 107220412 A | | 9/2017 | |
| CN | 107230472 A | | 10/2017 | |
| CN | 108216617 A | | 6/2018 | |
| CN | 108382606 A | | 8/2018 | |
| CN | 108216617 B | * | 4/2020 | ........... B64C 27/467 |
| CN | 112219036 A | * | 1/2021 | ............ F04D 29/66 |
| CN | 112487730 A | | 3/2021 | |
| CN | 113257214 A | * | 8/2021 | ............... B64F 5/60 |
| CN | 113421537 A | | 9/2021 | |
| EP | 1031136 B1 | * | 7/2004 | ....... G10K 11/17853 |
| EP | 3379529 A1 | * | 9/2018 | ........... G10K 11/178 |
| JP | H07160273 A | * | 6/1995 | ............ F04D 29/66 |

OTHER PUBLICATIONS

Johansson et al., "Active Noise Control in Propeller Aircraft", Nov. 2002, Conference for the Promotion of Research in IT at New Universities and at University Colleges in Sweden. (Year: 2002).*
Johansson et al., "Active Control of Propeller-Induced Noise in Aircraft Algorithms & Methods", Dec. 2000, Department of Telecommunications and Signal Processing Blekinge Institute of Technology. (Year: 2000).*
Johansson et al., "Active Noise Control in Aircraft Algorithms and Applications", Jan. 1998, Department of Applied Electronics Lund University. (Year: 1998).*
International Search Report from PCT/CN2022/073718, mailed Aug. 25, 2022.

* cited by examiner

HELICOPTER ACTIVE NOISE SUPPRESSION DEVICE INTEGRATING SOUND ARRAY AND ON-PROPELLER CONTROL

CROSS-REFERENCE TO RELATED APPLICATION

This application is a national stage application of International Patent Application No. PCT/CN2022/073718 filed on Jan. 25, 2022, which claims priority to Chinese Patent Application No. 202111476971.X filed on Dec. 6, 2021 and entitled "HELICOPTER ACTIVE NOISE SUPPRESSION DEVICE INTEGRATING SOUND ARRAY AND ON-PROPELLER CONTROL", both of which are hereby incorporated by reference in their entireties.

TECHNICAL FIELD

The present disclosure relates to the technical field of helicopter noise reduction, and in particular, to a helicopter active noise suppression device integrating a sound array and on-propeller control.

BACKGROUND

Helicopters are widely used in military and civilian fields due to their unique capabilities of vertically taking off and landing, hovering in the air, turning, and hedgehopping, and particularly play a more irreplaceable role in response to emergencies. However, people pay more and more attention to the disadvantage of high noise with the wide application of the helicopters all over the world in recent years. At present, the noise airworthiness regulations of both the International Civil Aviation Organization and Aviation Administrations of various countries have raised the noise problem of the helicopters to almost the same level as that of the safety and reliability of the helicopters. Noise control is gradually becoming an important aspect considered in modern helicopter designs. Due to the existence of many sound sources of external noise of the helicopters, it is of great significance to find a suppression technology that can effectively reduce all or most types of the noise for the development and use of the helicopters.

At present, the helicopter noise reduction technologies may be divided into the following categories:

The first type of technology is a passive noise suppression technology based on a blade aerodynamic shape design. Rotor noise of the helicopters is closely related to a blade shape. Researchers mainly reduce the rotor noise by changing a blade aerodynamic shape, such as using tapered and swept-back forms at a blade tip, and using a thin airfoil at an outer end of the blade, or designing a blade shape with large spanwise deformation. For example, the rotor blade of AH-64 helicopter uses a sweep-back tip, which reduces the noise level by about 2 dB. Black Hawk helicopter has been improved and designed for many times, and a rotor tip has changed from the original rectangle to a negative dihedral tapered form, so as to reduce the noise level. The Blue-edge rotor blade developed in Europe uses a double-sweep blade (a combination of sweep-forward and sweep-back), which can reduce the rotor aerodynamic noise by 2-3 dB in a level flight state.

The essence of this type of technology is to suppress noise by changing the blade shape to improve a rotor aerodynamic environment. Rotor aerodynamic performance directly depends on the blade shape. Therefore, in order to ensure that the rotor has excellent aerodynamic performance, it is necessary to compromise between noise and performance design when designing a low-noise rotor. Therefore, the main drawback of this type of technology is its weak noise suppression effect and inability to adapt to flight conditions.

The second type of technology is an active suppression technology based on blade motion control, such as High Harmonic Control (HHC) and Individual Blade Control (IBC). In this type of technology, an actuating device is additionally mounted above or below a fixed ring of a rotor hub. The torsion of a blade is changed by driving the overall blades or an individual blade to perform high-frequency motion, so as to change aerodynamic load distribution and flapping motion of the blade and increase a blade-vortex interaction distance, thereby realizing the control of the blade-vortex interaction noise of the rotor.

The type of technology is essentially to reduce a blade-vortex interaction phenomenon by changing the characteristics of a tip vortex, and has a main defect of only suppressing the blade-vortex interaction noise, and an adverse effect of increasing vibration while reducing the noise.

The third type of technology is a noise suppression technology based on flight path control. Noise radiation during the flight of a helicopter is not only related to the noise level of the rotor itself, but also depends on the flight mode, the attitude, etc. The technology uses this feature to change the characteristics of the sound pressure level and the propagation direction of the rotor noise through the changes of a flight path (including a flight attitude, a position, an operation, etc.), so that the noise radiation intensity in a specific area or position is reduced, thereby realizing noise reduction.

This type of technology only changes the propagation direction of the noise or avoids a high-noise flight state, which does not have the capability of reducing the noise level of the helicopter itself, so it is not a real noise suppression technology.

In conclusion, the current helicopter noise reduction technology has problems of weak noise suppression capability, limited suppression type, and poor adaptability of flight states. How to realize noise reduction of all-domain and all-type helicopter noise has become an urgent problem to be solved by those skilled in the art.

SUMMARY

An objective of the present disclosure is to provide a helicopter active noise suppression device integrating a sound array and on-propeller control, so as to realize noise reduction of all-domain and all-type helicopter noise.

The technical solution of the present disclosure is as follows:

A helicopter active noise suppression device integrating a sound array and on-propeller control includes an annular loudspeaker array, a plurality of force exciters, an error microphone, an Active Noise Cancellation (ANC) controller, a cockpit sensor, and an airborne computer.

The annular loudspeaker array is arranged on an outer side of a rotor hub above a fuselage. The force exciters are installed at blade trailing edges of a helicopter. The plurality of force exciters are installed at the trailing edge of each blade. Both the airborne computer and the cockpit sensor are installed inside a helicopter cockpit. The ANC controller is respectively connected with the annular loudspeaker array and the error microphone. The airborne computer is respectively connected with the cockpit sensor and the error microphone.

The plurality of force exciters are configured for generating force noise in an reversed phase to thickness noise. The plurality of force exciters are further configured for reducing rotor load noise and suppressing blade-vortex interaction noise. A noise radiation sphere database is stored in the airborne computer. The noise radiation sphere database includes a set of noise radiation spheres about flight speed, a set of noise radiation spheres about a tension coefficient, a set of noise radiation spheres about an angle of attack of a rotor disc, and a set of noise radiation spheres about tip speed. The cockpit sensor is configured for acquiring real-time flight parameters of the rotor. The flight parameters include the flight speed, the tension coefficient, the angle of attack of the rotor disc, and the tip speed. The airborne computer is configured for obtaining noise radiation spheres corresponding to the flight parameters according to the flight parameters and the noise radiation sphere database, and projecting the noise radiation spheres to an area to be subjected to noise reduction, so as to obtain the noise of the area to be subjected to noise reduction. Sound field characteristics corresponding to the flight parameters are stored on a spherical surface of the noise radiation sphere. The error microphone is configured for transferring an error vector between a noise control target and the noise of the area to be subjected to noise reduction to the ANC controller. The ANC controller is configured for controlling, according to the error vector, the annular loudspeaker array to generate noise in an reversed phase to the error vector.

Optionally, the blade trailing edge is 0.7R-1.0R; and R is a radius of the blade.

Optionally, each force exciter comprises a distributed trailing edge flap, a jet flow, and a tip winglet.

Optionally, each blade trailing edge is provided with the same number of force exciters.

Optionally, an exciting force generated by each force exciter is $F=F_n \sin(n\varphi+\varphi_0)$, wherein F indicates the exciting force; the exciting force is configured for generating force noise in the reversed phase to the thickness noise; $F_n$ indicates an amplitude of a $n^{th}$ order exciting force; $\varphi$ indicates a azimuth angle of the blade; and $\varphi_0$ indicates an initial triggering phase of the force exciter.

Optionally, the airborne computer is configured for interpolating from the noise radiation sphere database by using a numerical interpolation method according to the flight parameters to obtain the noise radiation sphere corresponding to the flight parameters.

Optionally, the airborne computer is further configured for taking the noise radiation sphere as a secondary spherical sound source, and obtaining the noise of the area to be subjected to noise reduction by only considering a geometric attenuation of sound and an atmospheric sound absorption effect and using a noise attenuation calculation formula according to a distance between a radius of the noise radiation sphere and the area to be subjected to noise reduction.

Optionally, the device further includes a spherical loudspeaker array.

The spherical loudspeaker array is arranged on a front or side of a cabin. The spherical loudspeaker array is connected to the ANC controller. The ANC controller is configured for receiving the error vector between the noise control target and the noise of the area to be subjected to noise reduction transferred by the error microphone, and controlling the spherical loudspeaker array to generate the noise in the reversed phase to the error vector.

Compared with the prior art, the present disclosure has the following beneficial effects:

The present disclosure discloses a helicopter active noise suppression device integrating a sound array and on-propeller control, where the annular loudspeaker array is arranged at a rotor hub and unsteady force exciters are installed at the blade trailing edge to construct a sound field in the reversed phase to the sound wave of an original sound field with an ANC principle, therby counteracting the noise and realizing the noise reduction of all-domain and all-type helicopter noise.

BRIEF DESCRIPTION OF THE DRAWINGS

The present disclosure will be further described below with reference to the drawings.

DETAILED DESCRIPTION OF THE EMBODIMENTS

The technical solutions in the embodiments of the present disclosure will be described in detail below with reference to the drawings in the embodiments of the present disclosure. It is apparent that the described embodiments are merely part of the embodiments of the present disclosure rather than all of the embodiments. Based on the embodiments of the present disclosure, all other embodiments obtained by those skilled in the art without creative work belong to the scope of protection of the present disclosure.

An objective of the present disclosure is to provide a helicopter active noise suppression device integrating a sound array and on-propeller control, so as to realize noise reduction of all-domain and all-type helicopter noise.

In order to make the abovementioned objective, features, and advantages of the present disclosure more apparent and more comprehensible, the present disclosure is further described in detail below with reference to the drawings and specific implementation.

Figure 1:
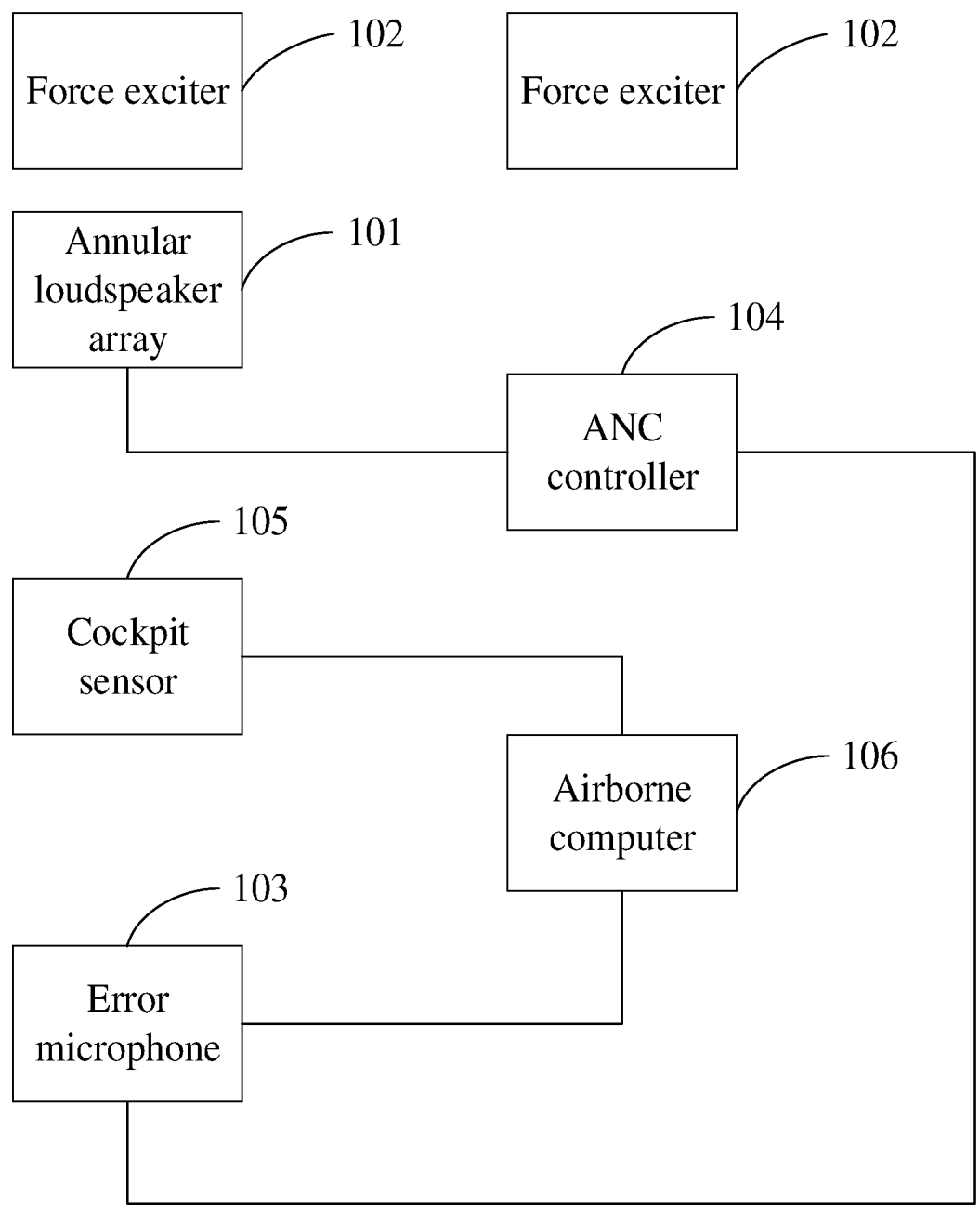
FIG. 1 illustrates a structural diagram of an embodiment of a helicopter active noise suppression device integrating a sound array and on-propeller control according to the present disclosure.

FIG. 1 illustrates a structural diagram of an embodiment of a helicopter active noise suppression device integrating a sound array and on-propeller control according to the present disclosure. Referring to FIG. 1, the helicopter active noise suppression device integrating the sound array and on-propeller control includes an annular loudspeaker array 101, a plurality of force exciters 102, an error microphone 103, an ANC controller 104, a cockpit sensor 105, and an airborne computer 106.

The annular loudspeaker array 101 is arranged on an outer side of a rotor hub 401 above a fuselage. The force exciters 102 are installed at a blade trailing edge of a helicopter. The plurality of force exciters 102 are installed at the trailing edge of each blade 402. Both the airborne computer 106 and the cockpit sensor 105 are installed inside a helicopter cockpit. The ANC controller 104 is respectively connected with the annular loudspeaker array 101 and the error microphone 103. The airborne computer 106 is respectively connected with the cockpit sensor 105 and the error microphone 103.

The plurality of force exciters 102 are configured for generating force noise in the reversed phase to thickness noise. The plurality of force exciters 102 are further configured for reducing rotor load noise and suppressing blade-vortex interaction noise. A noise radiation sphere database 210 is stored in the airborne computer 106. The noise radiation sphere database 210 includes a set of noise radiation spheres about flight speed, a set of noise radiation spheres about a tension coefficient, a set of noise radiation spheres about an angle of attack of a rotor disc, and a set of noise radiation spheres about tip speed. The cockpit sensor 105 is configured for acquiring real-time flight parameters of the rotor. The flight parameters include the flight speed, the tension coefficient, the angle of attack of the rotor disc, and the tip speed. The airborne computer 106 is configured for obtaining a noise radiation sphere corresponding to the flight parameters according to the flight parameters and the noise radiation sphere database 210, and radiating the noise radiation sphere to an area to be subjected to noise reduction, so as to obtain the noise of the area to be subjected to noise reduction. Sound field characteristics corresponding to the flight parameters are stored on a spherical surface of the noise radiation sphere. The error microphone 103 is configured for transferring an error vector between a noise control target and the noise of the area to be subjected to noise reduction to the ANC controller 104. The ANC controller 104 is configured for controlling, according to the error vector, the annular loudspeaker array 101 to generate noise in the reversed phase to the error vector.

Specifically, the blade trailing edge is 0.7R-1.0R, and R is a radius of the blade 402.

The force exciter 102 includes a distributed trailing edge flap, a jet flow, and a tip winglet. The force exciter 102 may specifically be implemented in a plurality of forms, such as the distributed trailing edge flap, the jet flow, and the tip winglet. All force exciters 102 are collectively referred to as force exciters from the perspective of principle. During specific implementation, there may be a flap, a jet flow, a winglet, etc.

A exciting force generated by the force exciter 102 is $F=F_n \sin(n\varphi+\varphi_0)$. In the formula, F indicates the exciting force; the exciting force is configured for generating force noise in the reversed phase to the thickness noise; $F_n$ indicates a amplitude of the $n^{th}$ order exciting force; $\varphi$ indicates a azimuth angle of the blade 402; and $\varphi_0$ indicates an initial triggering phase of the force exciter 102.

The airborne computer 106 is configured for interpolating from the noise radiation sphere database 210 by using a numerical interpolation method according to the flight parameters, so as to obtain the noise radiation sphere corresponding to the flight parameters. The airborne computer 106 is further configured for taking the noise radiation sphere as a secondary spherical sound source, and obtaining the noise of the area to be subjected to noise reduction by only considering a geometric attenuation of sound and an atmospheric sound absorption effect and using a noise attenuation calculation formula according to a distance between a radius of the noise radiation sphere and the area to be subjected to noise reduction.

Further, the helicopter active noise suppression device integrating the sound array and on-propeller control further includes a spherical loudspeaker array 403.

The spherical loudspeaker array 403 is installed on the front or side of a cabin. The spherical loudspeaker array 403 is connected to the ANC controller 104. The ANC controller 104 is configured for receiving the error vector between the noise control target and the noise of the area to be subjected to noise reduction transferred by the error microphone 103, and controlling the spherical loudspeaker array 403 to generate the noise in the reversed phase to the error vector.

In the present embodiment, each blade trailing edge is provided with the same number of force exciters 102.

The helicopter active noise suppression device integrating the sound array and on-propeller control uses the force exciters 102 arranged at the blade trailing edge to perform all-domain noise suppression as follows:

1. The suppression of the thickness noise specifically includes that: the force exciters 102 (the force generated by each force exciter 102 being parallel to an airfoil profile) are installed at the trailing edge of the outer end (0.7R-1.0R, R indicating the radius of the blade 402) of the blade 402, so that the exciting force can generate the unsteady force as shown in Formula (1), and the direction of the force is parallel to the chord direction of the airfoil profile. The number and layout positions of the force exciters 102 need to be determined according to specific aircraft types and noise reduction requirements.

$$F=F_n \sin(n\varphi+\varphi_0) \quad (1)$$

Where, F indicates the exciting force; $F_n$ indicates the amplitude of the n th-order exciting force; $\varphi$ indicates the azimuth angle of the blade 402; and $\varphi_0$ indicates an initial phase.

It can be known from an acoustic fundamental governing equation, that is, an Ffowcs Williams and Hawkings (FW-H) equation, that, the chordwise and periodic unsteady aerodynamic force generated by the force exciters 102 can generate force noise in a plane in a process of rotating with blades 402. The waveform of the noise is the same as that of the thickness noise of the blade 402 itself. Using this characteristic, a phase angle of the waveform of the force noise is changed by controlling the initial triggering phase (initial phase) of the force exciters 102, so that the phase of the force noise is just reversed to that of the thickness noise. In this way, the sound waveform of the noise of the exciting force and the sound waveform of the thickness noise form an anti-phase interaction such that the two columns of the sound waveforms can cancel out with each other, thereby suppressing the original noise. Since the propagation directionality of the force noise generated by the chordwise unsteady force is completely consistent with the directionality of the thickness noise, the method can suppress the all-domain noise.

2. The suppression of the blade-vortex interaction noise specifically includes that: the force exciters 102 can change the spanwise aerodynamic force of the blade 402 during operating, and improve the local aerodynamic distribution of the blade 402 by controlling the initial phase, so as to reduce the rotor load noise. In addition, the aerodynamic force generated by the force exciters 102 can affect the generation and propagation path of blade tip vortex, so that the tip vortex is far away from the plane of the rotor at a local position, thereby suppressing the blade-vortex interaction noise.

Figure 2A:
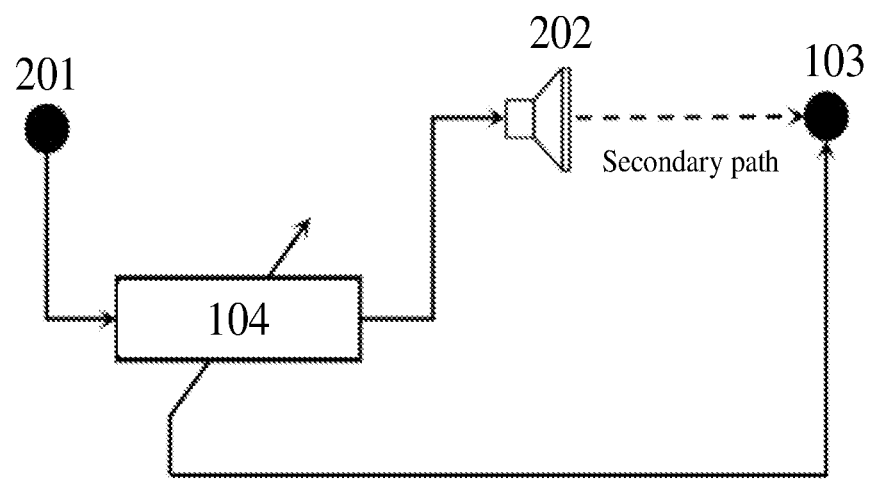
FIG. 2A illustrates schematic diagrams of a conventional feedforward ANC system.

The helicopter active noise suppression device integrating the sound array and on-propeller control uses loudspeaker arrays (including the annular loudspeaker array 101 and the spherical loudspeaker array 403) to perform directional suppression on the noise of a local area. The force exciters 102 can perform all-domain and low-amplitude noise reduction, while the introduction of the loudspeaker arrays can perform higher-amplitude noise suppression on a local area of concern, which specifically includes:

1. An external free sound field is controlled by a feedforward ANC system according to the ANC principle. FIG. 2A indicates a schematic diagram of a conventional feedforward ANC system, and FIG. 2B indicates a schematic diagram of an improved feedforward ANC system according to the present disclosure. As shown in FIG. 2A, a loudspeaker array (a secondary sound source 202) is installed on the outer side of the fuselage, and spectrum analysis is performed according to a noise signal (controlled noise) of the area of concern obtained from a reference microphone 201. By controlling an electro-acoustic transducer, the loudspeaker array can generate the noise in the reversed phase to the controlled noise, and the noise can be reduced after the two sound fields are synthesized. An ANC-based loudspeaker array control method is to synthesize a sound waveform by the frequency and phase of each order of the controlled noise signal, and thus more types of noise can be controlled, and the method can also be used for processing a broadband noise signal. The noise consists of a plurality of frequency components. A total noise waveform is synthesized according to the frequency and phase of each component. Phase cancellation actually refers to corresponding phase cancellation at each frequency.

2. The noise generated by the rotor may be considered as a spherical sound source, so the annular loudspeaker array 101 is arranged on the outer side of the rotor hub 401 and above the fuselage. Thus, the loudspeaker array (an antinoise sound source) has high similarity with the rotor (an original noise source) in space, which facilitates noise control.

3. The effect of the individual annular loudspeaker array 101 is effective. In order to achieve a better noise reduction effect and consider the feasibility of device installation, the spherical loudspeaker array 403 may also be arranged on the front or side of the cabin, and a layout area is subjected to enhancement of noise reduction by the spherical loudspeaker array 403. The annular loudspeaker array 101 and the spherical loudspeaker array 403 are both used for performing local noise reduction. The annular loudspeaker array 101 is necessary. The spherical loudspeaker array 403 may be added according to requirements. In other words, the annular loudspeaker array 101 is placed at the rotor hub 401, and then the spherical loudspeaker array 403 may be added to enhance the effect.

Figure 2B:
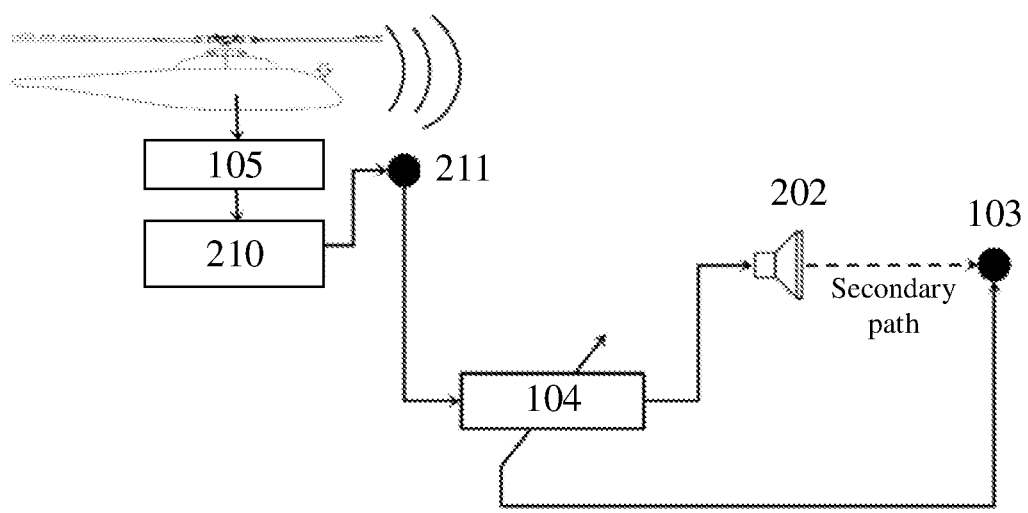
FIG. 2B illustrates schematic diagrams of an improved feedforward ANC system according to the present disclosure.
Figure 3:
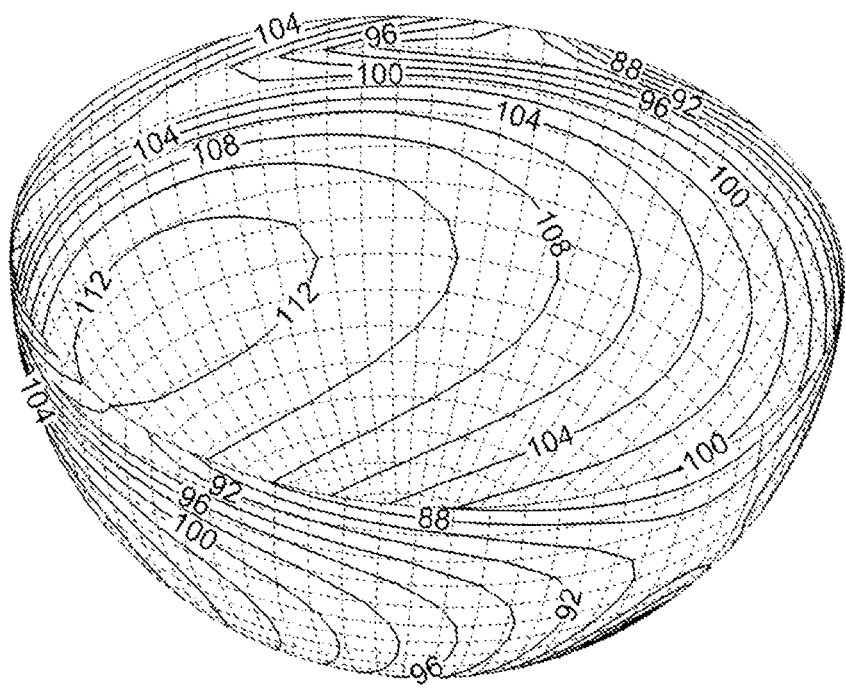
FIG. 3 illustrates a schematic diagram of a noise radiation sphere according to the present disclosure.

4. The feedforward ANC system is configured for controlling the loudspeaker array to generate the noise in the reversed phase to the controlled noise. The feedforward ANC system has very strong robustness. However, when the feedforward ANC system is applied to helicopter noise control, the biggest problem is that the reference microphone 201 cannot be installed at any forward position, that is, the noise characteristics of the area of concern cannot be obtained in real time, such that a complete feedback system cannot be constructed. The present disclosure proposes an improved feedforward ANC system for helicopter noise suppression as shown in FIG. 2B. In the improved system, a virtual reference microphone 211 is designed to replace the real reference microphone in the conventional feedforward ANC system, which realizes a closed loop operation of the system. The noise characteristics on the virtual reference microphone 211 can be obtained by the following steps:

Calculation of noise radiation sphere. As shown in FIG. 3, an individual noise radiation sphere is a hemispherical surface with the center of the rotor hub 401 as a sphere center and 2-5 times of the radius of the blade 402 as a radius. The sound field characteristics of the rotor in a specific flight state are stored on the hemispherical surface. The noise radiation sphere may be calculated through a aerodynamic noise program of the helicopter (an existing program).

Establishment of noise radiation sphere database 210. The noise characteristics of the rotor are described by using four flight parameters including the flight speed, the tension coefficient, the angle of attack of the rotor disc, and the tip speed. The range and discrete accuracy of the abovementioned four flight parameters are determined according to helicopter characteristics, use targets, etc. Any one of the parameters is taken, such as the flight speed, the calculation range may be 0-300 km/h, the interval may be 10 km/h, and a set of noise radiation spheres about the flight speed are calculated; and then a set of noise radiation spheres about the tension coefficient, a set of noise radiation spheres about the angle of attack of the rotor disc, and a set of noise radiation spheres about the tip speed are calculated and stored in categories, so as to form the noise radiation sphere database 210. The calculation of the noise radiation sphere is a conventional operation in this field. The noise radiation sphere can be calculated provided that the aerodynamic noise program of the helicopter is available.

Selection and interpolation of noise radiation sphere. The abovementioned established noise radiation sphere database 210 is stored in the airborne computer 106 within the cockpit. Since the database cannot cover all flight states, in actual use, real-time values of the four flight parameters including the flight speed, the tension coefficient, the angle of attack of the rotor disc, and the tip speed, are obtained according to the cockpit sensor 105, and interpolation is performed from the noise radiation sphere database 210 through numerical interpolation (a common numerical interpolation method), so as to obtain a noise radiation sphere reflecting the current flight state. The current flight state is the state indicating the current four parameters, including the flight speed, the tension coefficient, the angle of attack of the rotor disc and the tip speed, of the flying helicopter. The current flight state corresponds to the current flight parameters.

Calculation of noise of virtual reference microphone. The virtual reference microphone 211 is equivalent to the real reference microphone arranged in an area of concern for noise reduction (the area to be subjected to noise reduction). The setting position of the virtual reference microphone 211 is the area of concern for noise reduction. Since the radius of the noise radiation sphere is fixed, the area of concern for noise reduction is generally not located on the spherical surface. Therefore, the noise radiation sphere obtained by interpolating needs to be further radiated to the position of the virtual reference microphone 211 to obtain the noise characteristics on the virtual reference microphone, that is, the noise signal (controlled noise) of the area of concern obtained from the virtual reference microphone. In the implementation of this step, the noise radiation sphere may be taken as a secondary spherical sound source, and the noise of the area of concern, that is, the noise signal of the virtual reference microphone, can be obtained through the noise attenuation calculation formula by only considering the geometric attenuation of sound and the atmospheric sound absorption effect according to the distance between the radius of the noise radiation sphere and the position of the virtual reference microphone.

After the signal of the virtual reference microphone 211 is obtained, the signal of the error microphone 103 as shown in FIG. 2B is obtained according to the difference between the signal of the virtual reference microphone 211 and the target quantity (a desired noise control effect). The error component (error vector) is transferred to the ANC controller 104 by the error microphone 103, and the loudspeaker array (i.e. an output signal of the secondary sound source 202 of FIG. 2B) is automatically adjusted by the ANC controller 104, so as to generate more appropriate anti-noise for suppressing the noise, thereby forming complete feedforward control.

According to the present disclosure, external noise of a helicopter is suppressed by using a loudspeaker array. The loudspeaker array is combined with force exciters 102 at the blade trailing edge, and an active suppression technology for helicopter aerodynamic noise with all-domain and all-type noise reduction capability is proposed. For the problem that the reference loudspeaker cannot be arranged in an infinite free sound field, an improved forward feedback ANC system (improved feedforward ANC system) for helicopter noise suppression is established by a method of constructing the virtual reference loudspeaker based on a concept of data fusion.

Figure 4:
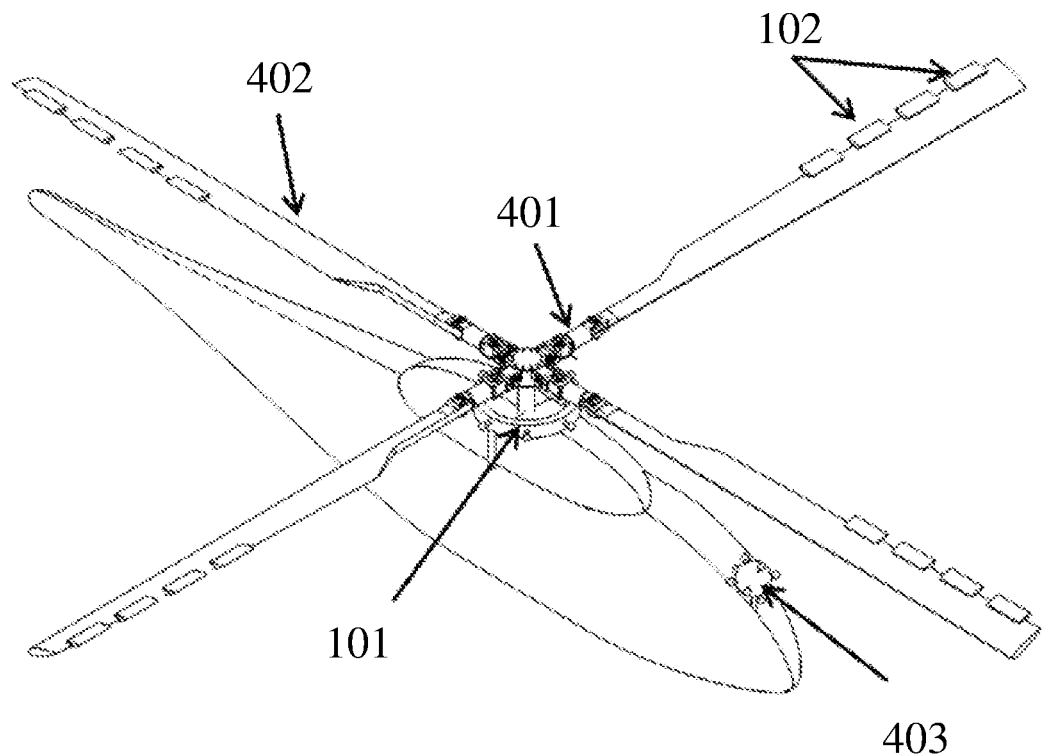
FIG. 4 illustrates a schematic structural diagram of the helicopter active noise suppression system integrating the sound array and on-propeller control according to the present disclosure.
Figure 5:
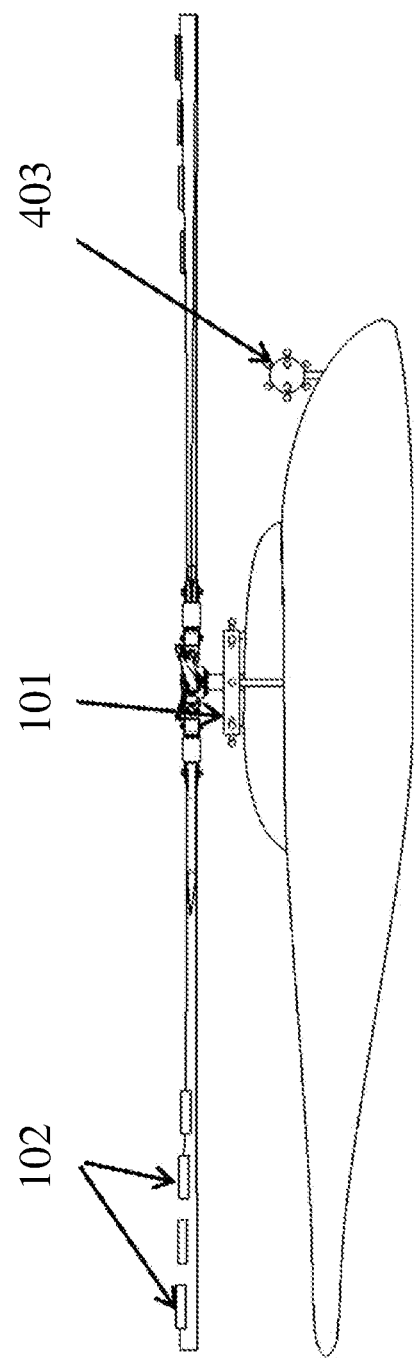
FIG. 5 illustrates a top view of the helicopter active noise suppression system integrating the sound array and on-propeller control according to the present disclosure.

The present disclosure provides a helicopter active noise suppression technology and system integrating a sound array and on-propeller control. The specific structure of the system is as shown in FIG. 4 and FIG. 5, which includes an annular loudspeaker array 101 at a rotor hub 401, a loudspeaker array on the outer side of a cockpit, and force exciters 102 at a blade trailing edge. The technology uses an active noise reduction principle, and an unsteady aerodynamic force is generated by the force exciters 102 arranged at the blade trailing edge. On one hand, sound waves in the reversed phase to the thickness noise may be generated. On the other hand, a rotor tip vortex may be destroyed, so as to form all-domain control on rotation noise and blade-vortex interaction noise. The force exciters 102 are limited by a narrow blade space and constraints of aerodynamic performance, and thus the noise suppression amplitude (i.e. the Decibel number of noise reduction) is limited. In order to enhance the noise suppression capability in a direction of concern, a sound field in the reversed phase to the sound wave of the original sound field is constructed by loudspeakers arranged at the rotor hub 401 or in front of the fuselage, so as to directionally enhance the noise suppression in a local area, thereby realizing the noise reduction of all-domain and all-type helicopter noise.

The helicopter aerodynamic noise active suppression technology integrating the loudspeaker array and on-propeller active control gives a specific implementation method and a system layout of the loudspeaker array and the on-propeller active control. The annular loudspeaker array 101 is installed at the rotor hub 401 or in front of the fuselage and the unsteady force exciters 102 are installed at the blade trailing edge, so as to construct the sound field in the reversed phase to the sound wave of the original sound field to counteract the noise by using the ANC principle, thereby realizing the noise reduction of all-domain and all-type helicopter noise, and effectively solving the problems of high noise radiation level and limited use of helicopters.

Compared with the prior art, the present disclosure has the following advantages:

(1) The adaptability is high. The noise suppression technology of the present disclosure belongs to the technical field of active control. A control law can be adjusted in real time to achieve a best noise suppression effect according to the flight and working states of a helicopter. Compared with a passive noise reduction technology, the present disclosure has the advantages of high flight state adaptability; and meanwhile, the system has little influence on the aerodynamic performance of the blade itself.

(2) The present disclosure has the capability of suppressing a plurality of types of noise. The existing noise suppression technologies all aim at a single type of noise. The on-propeller control based on the trailing edge force excitation in the present disclosure can suppress the blade-vortex interaction noise and the thickness noise, while the ANC loudspeaker array can suppress the rotation noise and the broadband noise, thereby realizing simultaneous suppression of a plurality of types of helicopter noise and greatly improving the noise suppression effect.

(3) The combination of all-domain/local noise reduction is realized. As described above, the on-propeller control method has the all-domain suppression capability to rotor thickness noise and blade-vortex interaction noise. Based on the ANC loudspeaker array, the noise suppression may be enhanced for a specific area, so as to realize a all-domain/local noise reduction combined noise suppression technology.

The implementation of the present disclosure is described in detail in combination with the accompanying drawings above, but the present disclosure is not limited to the above implementation. Within the scope of knowledge possessed by those of ordinary skill in the art, various changes can be made without departing from the purpose of the present disclosure.

What is claimed is:

1. A helicopter active noise suppression device integrating a sound array and on-propeller control, comprising an annular loudspeaker array, a plurality of force exciters, an error microphone, an Active Noise Cancellation (ANC) controller, a cockpit sensor, and an airborne computer, wherein the annular loudspeaker array is arranged on an outer side of a rotor hub above a fuselage;

the force exciters are installed at blade trailing edges of a helicopter; the plurality of force exciters are installed at the trailing edge of each blade; both the airborne computer and the cockpit sensor are installed inside a helicopter cockpit; the ANC controller is respectively connected with the annular loudspeaker array and the error microphone; and the airborne computer is respectively connected with the cockpit sensor and the error microphone;

the plurality of force exciters are configured for generating force noise in an reversed phase to thickness noise; the plurality of force exciters are further configured for reducing rotor load noise and suppressing blade-vortex interaction noise; a noise radiation sphere database is stored in the airborne computer; the noise radiation sphere database includes a set of noise radiation spheres about flight speed, a set of noise radiation spheres about a tension coefficient, a set of noise radiation spheres about an angle of attack of a rotor disc, and a set of noise radiation spheres about tip speed; the cockpit sensor is configured for acquiring real-time flight parameters of the rotor; the flight parameters include the flight speed, the tension coefficient, the angle of attack of the rotor disc, and the tip speed; the airborne computer is configured for obtaining noise radiation spheres corresponding to the flight parameters according to the flight parameters and the noise radiation sphere database, and projecting the noise radiation spheres to an area to be subjected to noise reduction, so as to obtain the noise of the area to be subjected to noise reduction; sound field characteristics corresponding to the flight parameters are stored on a spherical surface of the noise radiation sphere; the error microphone is configured for transferring an error vector between a noise control target and the noise of the area to be subjected to noise reduction to the ANC controller; and the ANC controller is configured for controlling, according to the error vector, the annular loudspeaker array to generate noise in an reversed phase to the error vector.

2. The helicopter active noise suppression device integrating the sound array and on-propeller control according to claim 1, wherein the blade trailing edge is 0.7R-1.0R; and R is a radius of the blade.

3. The helicopter active noise suppression device integrating the sound array and on-propeller control according to claim 1, wherein each force exciter comprises a distributed trailing edge flap, a jet flow, and a tip winglet.

4. The helicopter active noise suppression device integrating the sound array and on-propeller control according to claim 1, wherein each blade trailing edge is provided with the same number of force exciters.

5. The helicopter active noise suppression device integrating the sound array and on-propeller control according to claim 1, wherein an exciting force generated by each force exciter is $F=F_n \sin(n\varphi+\varphi_0)$, wherein F indicates the exciting force; the exciting force is configured for generating force noise in the reversed phase to the thickness noise; $F_n$ n indicates an amplitude of a $n^{th}$ order exciting force; $\varphi$ indicates a azimuth angle of the blade; and $\varphi_0$ indicates an initial triggering phase of the force exciter.

6. The helicopter active noise suppression device integrating the sound array and on-propeller control according to claim 1, wherein the airborne computer is configured for interpolating from the noise radiation sphere database by using a numerical interpolation method according to the flight parameters to obtain the noise radiation sphere corresponding to the flight parameters.

7. The helicopter active noise suppression device integrating the sound array and on-propeller control according to claim 6, wherein the airborne computer is further configured for taking the noise radiation sphere as a secondary spherical sound source, and obtaining the noise of the area to be subjected to noise reduction by only considering a geometric attenuation of sound and an atmospheric sound absorption effect and using a noise attenuation calculation formula according to a distance between a radius of the noise radiation sphere and the area to be subjected to noise reduction.

8. The helicopter active noise suppression device integrating the sound array and on-propeller control according to claim 1, further comprising a spherical loudspeaker array, wherein the spherical loudspeaker array is arranged on a front or side of a cabin; the spherical loudspeaker array is connected to the ANC controller; and the ANC controller is configured for receiving the error vector between the noise control target and the noise of the area to be subjected to noise reduction transferred by the error microphone, and controlling the spherical loudspeaker array to generate the noise in the reversed phase to the error vector.

* * * * *